United States Patent
Cmielowski et al.

(10) Patent No.: US 10,657,298 B2
(45) Date of Patent: May 19, 2020

(54) RELEASE CYCLE OPTIMIZATION BASED ON SIGNIFICANT FEATURES VALUES SIMULATION

(71) Applicant: International Business Machines Corporation, Armonk, NY (US)

(72) Inventors: Lukasz G. Cmielowski, Cracow (PL); Marek Franczyk, Cracow (PL); Tymoteusz Gedliczka, Cracow (PL); Andrzej J Wrobel, Cracow (PL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 129 days.

(21) Appl. No.: 15/183,011

(22) Filed: Jun. 15, 2016

(65) Prior Publication Data
US 2017/0364352 A1    Dec. 21, 2017

(51) Int. Cl.
*G06F 30/20*    (2020.01)
*G06F 8/71*    (2018.01)
(Continued)

(52) U.S. Cl.
CPC ........... *G06F 30/20* (2020.01); *G06F 8/71* (2013.01); *G06N 20/00* (2019.01); *G06N 20/10* (2019.01); *G06Q 10/06* (2013.01)

(58) Field of Classification Search
CPC .. G06F 7/78; G06F 8/00–78; G06F 9/44–455; G06F 11/36
See application file for complete search history.

(56) References Cited

U.S. PATENT DOCUMENTS

| 8,006,222 B2 * | 8/2011 | Ruhe ............... G06Q 10/10 705/12 |
| 8,812,341 B2 | 8/2014 | Ehben et al. |

(Continued)

FOREIGN PATENT DOCUMENTS

CA    1304516 C    6/1992

OTHER PUBLICATIONS

BMC, [online]; [retrieved on Feb. 17, 2016]; retrieved from the Internet http://www.bmc.com/it-solutions/release-lifecycle-management.html. "Software release management to accelerate release cycles and meet DevOps milestones,", 7p.

(Continued)

*Primary Examiner* — S. Sough
*Assistant Examiner* — Cheneca Smith
(74) *Attorney, Agent, or Firm* — Cantor Colburn LLP; Scott Dobson

(57) ABSTRACT

Embodiments include a system for release cycle optimization; the system includes a processor configured to perform a method. The method includes accessing, by a processor, historical data relating to a plurality of software version each having a plurality of attributes; selecting a subset of attributes from the plurality of attributes; receiving a set of data values for each of the subset of attributes from the plurality of attributes; performing one or more simulations of a software development cycle utilizing the set of data values; and obtaining a set of results from the one or more simulations comprising a plurality of predicted field defects values corresponding to each of the set of data values.

17 Claims, 3 Drawing Sheets

(51) Int. Cl.
*G06N 20/00* (2019.01)
*G06N 20/10* (2019.01)
*G06Q 10/06* (2012.01)

(56) References Cited

U.S. PATENT DOCUMENTS

| | | | | |
|---|---|---|---|---|
| 2005/0216879 | A1* | 9/2005 | Ruhe | G06Q 10/10 |
| | | | | 717/101 |
| 2008/0263507 | A1* | 10/2008 | Chang | G06Q 10/00 |
| | | | | 717/104 |
| 2009/0006173 | A1* | 1/2009 | Farrell | G06Q 10/06 |
| | | | | 705/7.13 |
| 2010/0017784 | A1 | 1/2010 | O'Mahony et al. | |
| 2011/0067005 | A1* | 3/2011 | Bassin | G06F 11/008 |
| | | | | 717/127 |
| 2013/0325763 | A1* | 12/2013 | Cantor | G06Q 10/0633 |
| | | | | 706/12 |
| 2014/0344775 | A1* | 11/2014 | Dunne | G06Q 10/06 |
| | | | | 717/101 |
| 2014/0365638 | A1* | 12/2014 | Shah | H04L 41/147 |
| | | | | 709/224 |
| 2015/0095875 | A1 | 4/2015 | Chen et al. | |

OTHER PUBLICATIONS

IBM Pressbooks, [online]; [retrieved on Feb. 17, 2016]; retrieved from the Internet http://www.ibmpressbooks.com/articles/article.asp?p=1323999&seqNum=4. Klosterboer, "Defining ITIL Change and Release Management Processes," Implementing ITIL Change and Release, Mar. 2, 2009, 3p.

IBM, "Dynamic Release Engine for the Optimization of Manufacturing, Packaging, and Shipment in a Complex Configured Environment", IP.com IPCOM000193932D, Jun. 5, 2009, 9p.

* cited by examiner

US 10,657,298 B2

RELEASE CYCLE OPTIMIZATION BASED ON SIGNIFICANT FEATURES VALUES SIMULATION

BACKGROUND

The present disclosure relates to release cycle optimization, and more specifically, to methods, systems, and computer program products for release cycle optimization based on significant features values simulation.

Software release cycle describes the life and stages of development and maturity of a software product. Planning for software release cycle focuses on how to organize development teams, assign backlog items, and plan iterations; all to ensure the highest probability of a successful software product release. Historically, teams use experience during the planning phase and base these planning decisions on knowledge and experience concerning particular tasks and development history from a particular area. From this historical planning, there is a trend to overestimate the development effort rather than underestimate the development effort.

Not all circumstances and parameters are taken into consideration based upon the above planning methodology. With the above planning methodology, the area of product or team which had previous problems with delivering a software product on time or of good quality, are analyzed and reviewed for planning purposes. With this methodology, only single parameters are evaluated and based on this single parameter, software planning decisions are made.

SUMMARY

Embodiments include a computer system for release cycle optimization, the computer system including a server having a processor, the processor configured to perform a method. The method includes accessing, by a processor, historical data relating to a plurality of software version each having a plurality of attributes; selecting a subset of attributes from the plurality of attributes; receiving a set of data values for each of the subset of attributes from the plurality of attributes; performing one or more simulations of a software development cycle utilizing the set of data values; and obtaining a set of results from the one or more simulations comprising a plurality of predicted field defects values corresponding to each of the set of data values.

Embodiments also include a computer program product for release cycle optimization, the computer program product including a non-transitory computer readable storage medium having computer readable program code embodied therewith. The computer readable program code including computer readable program code configured to perform a method. The method includes accessing, by a processor, historical data relating to a plurality of software version each having a plurality of attributes; selecting a subset of attributes from the plurality of attributes; receiving a set of data values for each of the subset of attributes from the plurality of attributes; performing one or more simulations of a software development cycle utilizing the set of data values; and obtaining a set of results from the one or more simulations comprising a plurality of predicted field defects values corresponding to each of the set of data values.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

In accordance with exemplary embodiments of the disclosure, methods, systems and computer program products for release cycle optimization are provided. In exemplary embodiments, the method includes receiving and analyzing historical data related to a previous software product release. The method then utilizes a number of statistical analyses to determine a set of attributes that are significant in predicting a successful software product release. One or more simulation models are built using the significant attributes and a range of values for each of the significant attributes. The one or more simulations are performed and a set of values are selected based upon the number of predicted field defects from the one or more simulations.

Figure 1:
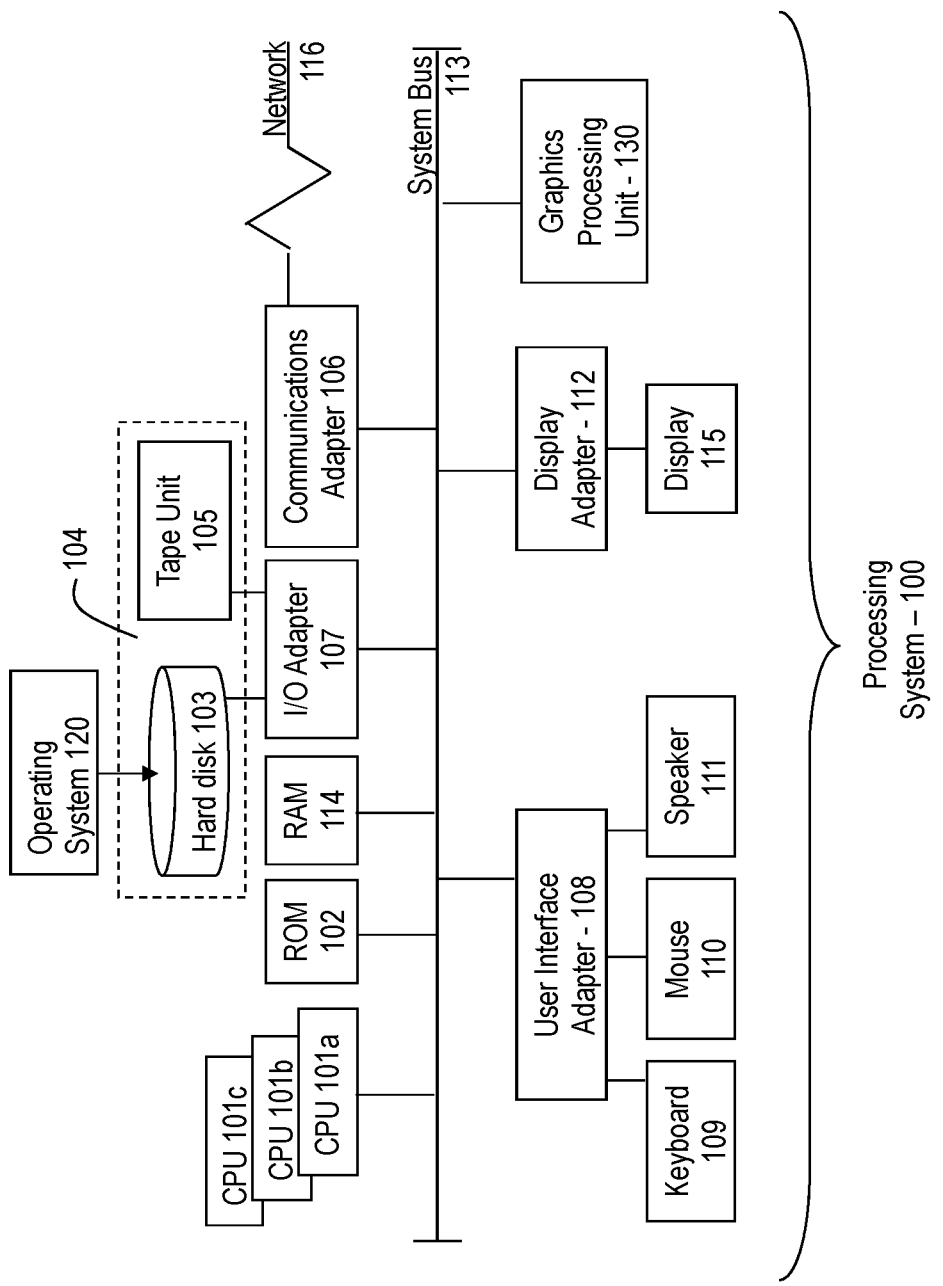
FIG. 1 illustrates a block diagram of a computer system for use in practicing the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system coordinate the functions of the various components shown in FIG. 1.

Figure 2:
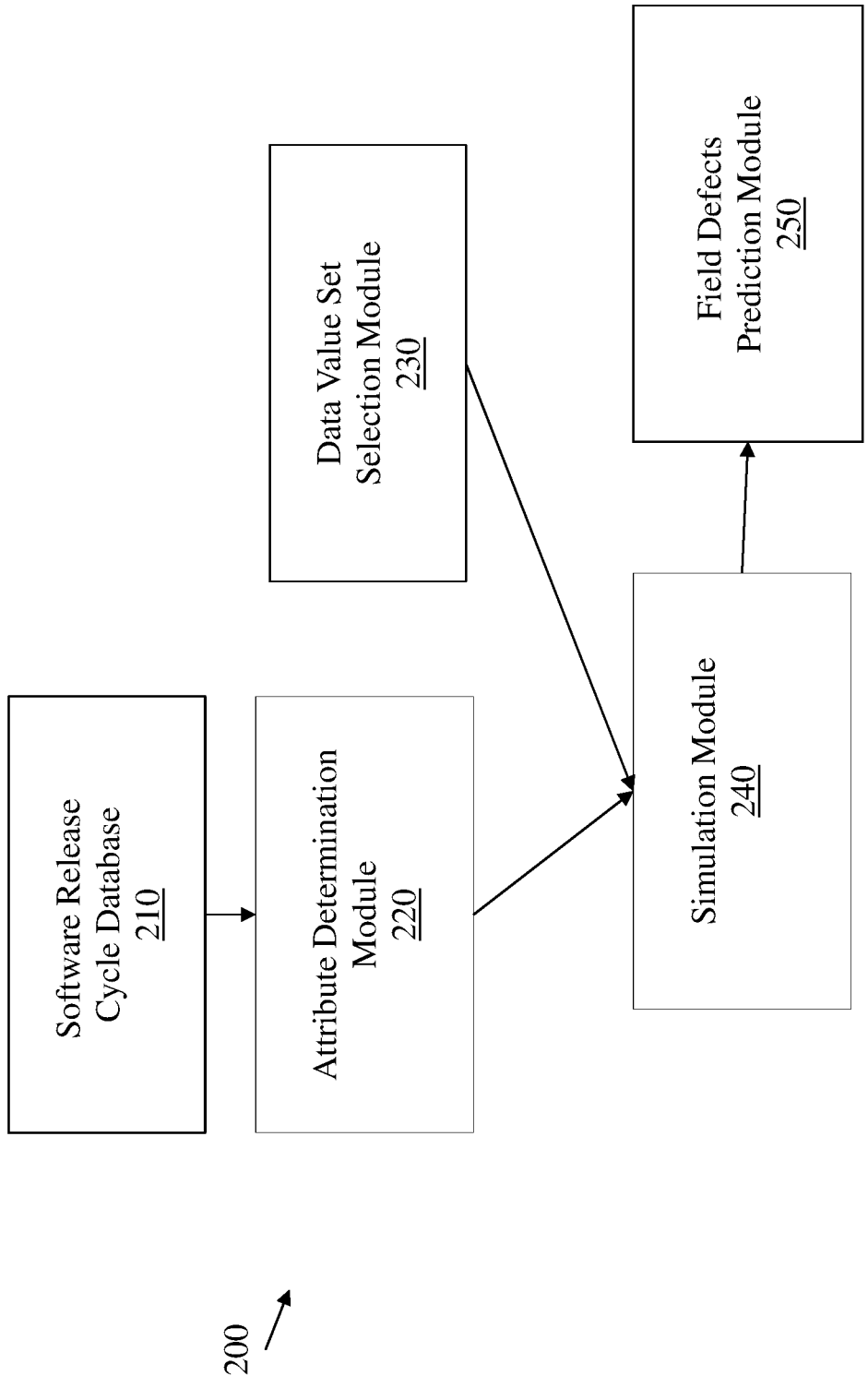
FIG. 2 illustrates a block diagram of a system for release cycle optimization in accordance with an embodiment.

FIG. 2 is a block diagram illustrating a release cycle optimization system 200 according to an embodiment. As shown in FIG. 2, the system 200 includes a software release cycle database 210, an attribute determination module 220, a data value set selection module 230, a simulation module 240, and a field defects prediction module 250.

In one or more embodiments, the software release cycle database 210 contains historical data on previous software releases and/or previous product releases corresponding to various software development cycles. Each release contains various attributes and attributes data. In one or more embodiments, these attributes include the size of the development team, the development time, the size of the test team, the testing time period, automation test hot factors, the number of executed test cases, the number of characteristic defects found, and an iteration length. These attributes are selected based upon the historical performance data for previous software releases to indicate a desired software release performance.

Table 1 contains an exemplary embodiment of historical data on previous software releases that can be found inside the software release cycle database 210. Table 1 lists a total of six attributes for five software or product releases with an output attribute for the number of field defects for each release version. Field defects represent faults and anomalies in a software product that may occur in the field, i.e. with a consumer or user of the software product.

TABLE 1

| Example of historical data with sample attributes | | | | | | |
|---|---|---|---|---|---|---|
| | Size of Development Team | Developing Time | Number of Executed Test Cases | Test Team Size | Testing Time | Iteration Length | Number of Field Defects |
| Release 1 | 5 | 100 | 220 | 4 | 120 | 15 | 22 |
| Release 2 | 6 | 30 | 330 | 3 | 100 | 12 | 50 |
| Release 3 | 5 | 55 | 660 | 3 | 50 | 10 | 63 |
| Release 4 | 7 | 82 | 580 | 5 | 200 | 11 | 12 |
| Release 5 | 4 | 99 | 330 | 2 | 25 | 5 | 121 |

In one or more embodiments, the attribute determination module 220 is configured to select a set of attributes that are deemed significant attributes. Significant attributes are attributes that allow for classification of the previous software release from Table 1 into one of a number of classes. For example, looking at Table 1, there may be two classes such as field defects number within acceptable limits and field defects number outside acceptable limits. Setting the acceptable limits of field defects at a value of fifty-five, the Table 1 results show only three releases (Release 1, Release 2, and Release 4) that would be within acceptable limits for field defect numbers.

In one or more embodiments, the attribute determination module 220 will determine and select significant attributes for later simulation. The determination of significant attributes can be performed utilizing machine learning algorithms, such as support vector machines (SVM) algorithm. A machine learning algorithm analyzes multiple parameters and correlations/dependencies between these multiple parameters. For example, pairs of parameters or features may show a team A and a product area B which causes a lot of field defects or failures. However, for example, team A and product area C may show results of higher quality and delivery dates that are on time or even ahead of time. Utilizing a machine learning algorithm would allow for selection of attributes that are common to a product release with low field defects.

Referring now to Table 2, there is shown an exemplary embodiment of a sample list of significant attributes: iteration length, the number of executed test cases, and size of the test team. In an embodiment, instead of selecting all six attributes from Table 1, this number is reduced to three significant attributes as shown in Table 2. In one or more embodiments, the three significant attributes are selected using a feature extraction method such as, for example, a machine learning algorithm such as support vector machines algorithm. The remaining attributes would remain unchanged.

TABLE 2

| Sample list of significant attributes | | | |
|---|---|---|---|
| | Iteration Length | Number of Executed Test Cases | Size of Test Team | Number of Field Defects |
| Release 1 | 15 | 220 | 4 | 22 |
| Release 2 | 12 | 330 | 3 | 50 |
| Release 3 | 10 | 660 | 3 | 63 |
| Release 4 | 11 | 580 | 5 | 12 |
| Release 5 | 5 | 330 | 2 | 121 |

In one or more embodiments, after selection of the significant attributes by the attribute determination module 220, the data value set selection module 230 supplies data values for the attributes. In one or more embodiments, these data values for each of the attributes are then supplied to the simulation module 240. The simulation module 240 will build a simulation model wherein the data values for the significant attributes are submitted in a range of values for simulation. For example, the significant attribute of test team size can range from one to six, the number of executed test cases can range from 100 to 1000, and the iteration length can range from five to twenty.

Referring now to Table 3, there is shown an exemplary embodiment of sample content simulation based on all significant attributes. The range of values that are inputted into the simulation content can be based upon resource constraints associated with the release of the software or product.

TABLE 3

Sample content simulation based on all significant attributes

|  | Size of Development Team | Development Time | Test Team Size | Testing Time | Number of Executed Test Cases | Iteration Length | Number of Field Defects |
|---|---|---|---|---|---|---|---|
| Planned Release | 4 | 99 | 1-6 | 25 | 100-1000 | 5-20 | ? |

In one or more embodiments, once a simulation model is built based upon the significant attributes, the simulation module 240 will perform one or more simulations to identify optimal values based upon the number of field defects.

Referring now to Table 4, there are shown simulation results based upon all the significant attributes. In one or more embodiments, each simulation result and its corresponding combination of factors are being checked against a desired level of field defects. For example, a field defect value threshold can be set at thirty field defects. A simulation data set that is considered in-range would have a field defects value lower than or equal to the field defect value threshold. A simulation data set that is considered out-of-range would have a field defects value higher than the field defects value threshold. For example, the field defects threshold may be fifty which results in only four candidate simulation result combinations as shown in Table 4. The lowest value of twelve field defects results from a test team of six people, a thousand executed test cases, and an iteration length of five. However, should there be additional resource constraints, an acceptable result of forty-four field defects is obtained when the number of executed test cases is reduced from one thousand to five hundred.

In one or more embodiments, resource constraints guide the selection of attribute combinations for implementation of a software release cycle. In the above example, if the field defect threshold is fifty and the lowest costing data set results are below the threshold, then the system would select that set. After the completion of one or more simulations, the system 200 can display the results to any of a software engineer, hardware engineer, and a human resources individual to assess the needs described by the simulations result and the human and capital resources available to fit these needs. For example, test team sizes may be restricted based upon budgets and available personnel.

In one or more embodiments, the system 200 may exclude simulation results that do not fit within the resources available for use in the development of the software. For example, a company may have security constraints for certain types of software release projects. These security constraints may confine a software release project to a certain location within the company based upon the type of software being developed. The system 200 may develop a list of individuals to work on the project and then exclude individuals who do not work in the specified location or it may exclude a simulation result based upon this constraint. Additionally, a company may have a limit on the number of software release projects an individual can work on at one time. If the system 200 identifies an individual that has too many projects, it may exclude this individual from being listed as a resource in the simulation or may exclude the simulation result based upon this constraint.

In one or more embodiments, the system 200 may identify a need for an individual with a certain skill set to work on the software release project. For example, a specific type of software engineer with knowledge of a computer language

TABLE 4

Simulation results based on all significant attributes

|  | Size of Development Team | Development Time | Test Team Size | Testing Time | Number of Executed Test Cases | Iteration Length | Number of Field Defects |
|---|---|---|---|---|---|---|---|
| Simulation 1 | 4 | 99 | 1 | 25 | 100 | 5 | 215 |
| Simulation 2 | 4 | 99 | 1 | 25 | 100 | 10 | 211 |
| Simulation 3 | 4 | 99 | 1 | 25 | 100 | 15 | 200 |
| Simulation 4 | 4 | 99 | 1 | 25 | 300 | 5 | 220 |
| Simulation 5 | 4 | 99 | 1 | 25 | 300 | 10 | 212 |
| Simulation 6 | 4 | 99 | 1 | 25 | 300 | 15 | 211 |
| Simulation 7 | 4 | 99 | 1 | 25 | 500 | 5 | 199 |
| Simulation ... | 4 | 99 | ... | 25 | ... | ... | ... |
| Simulation N-3 | 4 | 99 | 6 | 25 | 500 | 15 | 44 |
| Simulation N-2 | 4 | 99 | 6 | 25 | 1000 | 5 | 12 |
| Simulation N-1 | 4 | 99 | 6 | 25 | 1000 | 10 | 25 |
| Simulation N | 4 | 99 | 6 | 25 | 1000 | 15 | 16 | may be necessary for development. Should this type of software engineer not be employed at the company, the system 200 may trigger a workflow for human resources to hire an individual with the proper skill set. The system 200 may also trigger training for individuals within the company to develop a skill set such as, for example, learning a new computer language. In one or more embodiments, the system 200 can develop a projected budget for a software release project based upon the identified resources within a company. For example, if software engineer A has the proper skill set to work on a project, his or her cost may be identified within the budget and may be compared against another software engineer within the company. Another engineer, software engineer B, may be able to work on the project for a lower cost based upon his or her salary. A simulation result may be excluded if it exceeds a budget constraint.

Figure 3:
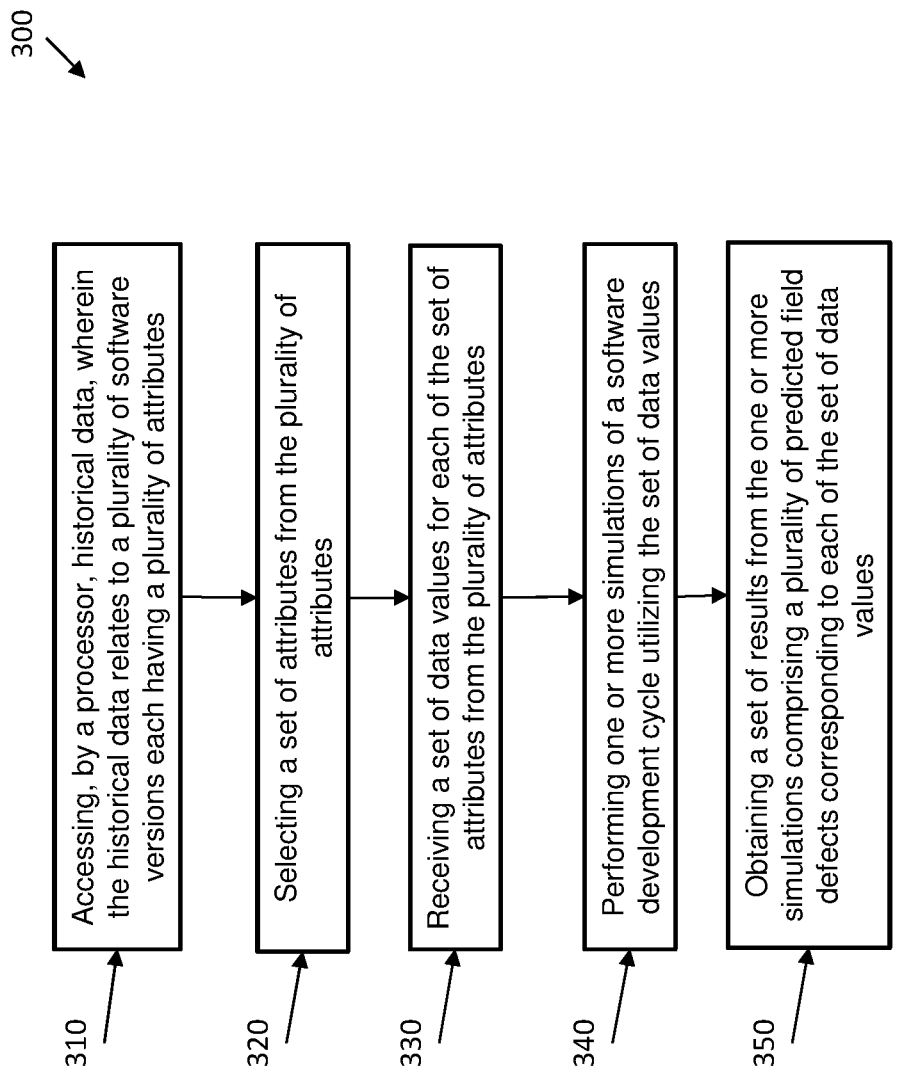
FIG. 3 illustrates a flow diagram of a method for release cycle optimization in accordance with an embodiment.

Referring now to FIG. 3 there is shown a flow diagram illustrating a method 300 for release cycle optimization according to one or more embodiments. As shown in block 310, the method 300 accesses, by a processor 101, historical data, wherein the historical data relates to a plurality of software versions each having a plurality of attributes. Next, at block 320, the method 300 selects a set of attributes from the plurality of attributes. The method 300 then receives a set of data values for each of the set of attributes from the plurality of attributes, as shown at block 330. Next, at block 340, the method 300 performs one or more simulations of a software development cycle utilizing the set of data values. At block 350, the method 300 obtains a set of results from the one or more simulations comprising a plurality of predicted field defects corresponding to each of the set of data values.

Additional processes may also be included. It should be understood that the processes depicted in FIG. 3 represent illustrations, and that other processes may be added or existing processes may be removed, modified, or rearranged without departing from the scope and spirit of the present disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting-data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for release cycle optimization, the method comprising:
   accessing, by a processor, historical data relating to a plurality of software versions each having a plurality of attributes;
   determining a subset of attributes from the plurality of attributes based on a feature vector, generated by a machine learning model, comprising a plurality of features extracted from the historical data, wherein the subset of attributes are determined based at least in part on a desired software release performance associated with a software release;
   receiving a set of data values for each attribute in the subset of attributes from the plurality of attributes;
   performing one or more simulations of a software development cycle utilizing the set of data values; and
   obtaining a set of optimized results from the one or more simulations comprising a plurality of predicted field defects values corresponding to each of the set of data values, wherein the set of results comprise a project cost associated with each result in the set of optimized results;
   determining one or more constraints associated with a business organization for implementation of the software release;
   discarding one or more optimized results in the set of optimized results that conflict with at least one constraint of the one or more constraints to determine a second set of optimized results;
   identifying, by the processor, a resource need for each of the plurality of attributes based on the second set of optimized results, wherein the resource need comprises an individual outside the business organization having a skill set associated with the set of optimized results; and
   generating, for a user, a workflow to obtain the resource.

2. The method according to claim 1, further comprising:
   receiving a threshold field defect value; and
   identifying, by a user, a plurality of results from the set of optimized results with a predicted field defect value below the threshold field defect value.

3. The method according to claim 2, further comprising:
   accessing an availability of resources; and
   selecting one or more of the plurality of optimized results based upon the predicted field defects values, the resource need, and the availability of resources.

4. The method according to claim 3, wherein the availability of resources is determined by at least one of a software engineer, a hardware engineer, and a human resources individual.

5. The method according to claim 1, wherein the machine learning model comprises a support vector machines algorithm.

6. The method according to claim 1, wherein the plurality of attributes comprise at least one of a size of a development team, a development time period, a size of a test team, a number of executed test cases, and an iteration length.

7. A system for release cycle optimization, the system comprising:
   a processor configured to:
      access historical data, wherein the historical data relates to a plurality of software versions each having a plurality of attributes;
      determine a subset of attributes from the plurality of attributes based on a feature vector, generated by a machine learning model, comprising a plurality of features extracted from the historical data, wherein the subset of attributes are determined based at least in part on a desired software release performance associated with a software release;
      receive a set of data values for each of the subset of attributes from the plurality of attributes; and
      perform one or more simulations of a software development cycle utilizing the set of data values; and
      obtain a set of optimized results from the one or more simulations comprising a plurality of predicted field defects values corresponding to each of the set of data values, wherein the set of results comprise a project cost associated with each result in the set of results;
      determine one or more constraints associated with a business organization for implementation of the software release;
      discard one or more optimized results in the set of optimized results that conflict with at least one constraint of the one or more constraints to determine a second set of optimized results;
      identify a resource need for each of the plurality of attributes based on the second set of results, wherein the resource need comprises an individual outside the business organization having a skill set associated with the set of optimized results; and
      generate, for a user, a workflow to obtain the resource.

8. The system according to claim 7, further comprising:
the processor configured to:
receive a threshold field defect value; and
identify, by a user of the processor, a plurality of results from the set of optimized results with a predicted field defect value below the threshold field defect value.

9. The system according to claim 8, further comprising:
the processor configured to:
access an availability of resources; and
select one or more of the plurality of results based upon the predicted field defects values, the resource need, and the availability of resources.

10. The system according to claim 9, wherein the availability of resources is determined by at least one of a software engineer, a hardware engineer, and a human resources individual.

11. The system according to claim 7, wherein the machine learning model comprises a support vector machines algorithm.

12. The system according to claim 7, wherein the plurality of attributes comprise at least one of a size of a development team, a development time period, a size of a test team, a number of executed test cases, and an iteration length.

13. A computer program product for release cycle optimization, the computer program product comprising a computer readable storage medium having program instructions embodied therewith, wherein the computer readable storage medium is not a transitory signal per se, the program instructions executable by a processor to cause the processor to perform a method comprising:
accessing, by a processor, historical data, wherein the historical data relates to a plurality of software versions each having a plurality of attributes;
determining a subset of attributes from the plurality of attributes based on a feature vector, generated by a machine learning model, comprising a plurality of features extracted from the historical data, wherein the subset of attributes are determined based at least in part on a desired software release performance associated with a software release;
receiving a set of data values for each of the subset of attributes from the plurality of attributes; and
performing one or more simulations of a software development cycle utilizing the set of data values; and
obtaining a set of optimized results from the one or more simulations comprising a plurality of predicted field defects values corresponding to each of the set of data values, wherein the set of results comprise a project cost associated with each result in the set of results;
determining one or more constraints associated with a business organization for implementation of the software release;
discarding one or more optimized results in the set of optimized results that conflict with at least one constraint of the one or more constraints to determine a second set of optimized results;
identifying, by the processor, a resource need for each of the plurality of attributes based on the second set of results, wherein the resource need comprises an individual outside the business organization having a skill set associated with the set of optimized results; and
generating, for a user, a workflow to obtain the resource.

14. The computer program product according to claim 13, further comprising:
receiving a threshold field defect value; and
identifying, by a user, a plurality of results from the set of optimized results with a predicted field defect value below the threshold field defect value.

15. The computer program product according to claim 14, further comprising:
accessing an availability of resources; and
selecting one or more of the plurality of results based upon the predicted field defects values, the resource need, and the availability of resources.

16. The computer program product according to claim 13, wherein the machine learning model comprises a support vector machines algorithm.

17. The computer program product according to claim 13, wherein the plurality of attributes comprise at least one of a size of a development team, a development time period, a size of a test team, a number of executed test cases, and an iteration length.

* * * * *